United States Patent
Nitta et al.

(10) Patent No.: US 9,746,535 B2
(45) Date of Patent: Aug. 29, 2017

(54) MAGNETIC RESONANCE IMAGING APPARATUS

(71) Applicant: Toshiba Medical Systems Corporation, Otawara-shi, Tochigi-ken (JP)

(72) Inventors: Shuhei Nitta, Tokyo (JP); Tomoyuki Takeguchi, Kanagawa (JP); Nobuyuki Matsumoto, Tokyo (JP); Shigehide Kuhara, Tochigi (JP)

(73) Assignee: TOSHIBA MEDICAL SYSTEMS CORPORATION, Otawara-shi, Tochigi (JP)

( * ) Notice: Subject to any disclaimer, the term of this patent is extended or adjusted under 35 U.S.C. 154(b) by 0 days.

(21) Appl. No.: 15/134,815

(22) Filed: Apr. 21, 2016

(65) Prior Publication Data
US 2016/0238682 A1 Aug. 18, 2016

Related U.S. Application Data

(62) Division of application No. 13/670,875, filed on Nov. 7, 2012, now Pat. No. 9,348,006.

(30) Foreign Application Priority Data

Nov. 11, 2011 (JP) ................................ 2011-247995

(51) Int. Cl.
*G01V 3/00* (2006.01)
*G01R 33/483* (2006.01)
(Continued)

(52) U.S. Cl.
CPC ....... *G01R 33/4835* (2013.01); *G01R 33/246* (2013.01); *G01R 33/30* (2013.01);
(Continued)

(58) Field of Classification Search
USPC ......................................................... 324/318
See application file for complete search history.

(56) References Cited

U.S. PATENT DOCUMENTS 6,822,447 B1 * 11/2004 Yamagata .......... G01R 33/3806
324/309
6,828,787 B2 12/2004 Oesingmann
(Continued)

FOREIGN PATENT DOCUMENTS

CN 101273919 A 10/2008
JP 2002-140689 5/2002
(Continued)

OTHER PUBLICATIONS

SCMR Image Acquisition Protocols, "CMR Image Acquisition Protocols", Version 1.0, (Mar. 2007), pp. 1-16.
(Continued)

*Primary Examiner* — Rodney Fuller
(74) *Attorney, Agent, or Firm* — Nixon & Vanderhye P.C.

(57) ABSTRACT

A magnetic resonance imaging apparatus according to an embodiment includes an acquiring unit, a detecting unit, a deriving unit, and an imaging controller. The acquiring unit acquires three-dimensional image data including a target organ. The detecting unit detects an upper end position and a lower end position of the target organ in the three-dimensional image data. The deriving unit derives an imaging range of subsequent imaging performed after acquisition of the three-dimensional image data based on the upper end position and the lower end position of the target organ. The imaging controller controls performance of the subsequent imaging in accordance with the imaging range.

13 Claims, 15 Drawing Sheets

(51) Int. Cl.
- *G01R 33/34* (2006.01)
- *G01R 33/24* (2006.01)
- *G01R 33/54* (2006.01)
- *G01R 33/30* (2006.01)
- *G01R 33/3875* (2006.01)

(52) U.S. Cl.
CPC ........... *G01R 33/34* (2013.01); *G01R 33/543* (2013.01); *G01R 33/3875* (2013.01)

(56) References Cited

U.S. PATENT DOCUMENTS

| | | | |
|---|---|---|---|
| 7,280,862 B2 | 10/2007 | Gupta et al. | |
| 7,486,076 B2* | 2/2009 | Nagao | A61B 5/055 324/307 |
| 7,684,604 B2 | 3/2010 | Bystrov et al. | |
| 2004/0232916 A1 | 11/2004 | Kamimura et al. | |
| 2006/0152220 A1* | 7/2006 | Nabetani | G01R 33/3415 324/309 |
| 2008/0081987 A1* | 4/2008 | Miyazaki | A61B 5/055 600/410 |
| 2008/0242968 A1 | 10/2008 | Claus et al. | |
| 2009/0278535 A1* | 11/2009 | Takizawa | A61B 5/055 324/309 |
| 2009/0309595 A1* | 12/2009 | Yatsui | A61B 5/0555 324/309 |
| 2010/0060284 A1* | 3/2010 | Sugiura | G01R 33/56383 324/318 |
| 2010/0102239 A1 | 4/2010 | Hahn et al. | |
| 2010/0189328 A1 | 7/2010 | Boernert et al. | |
| 2011/0178388 A1 | 7/2011 | Kuhara et al. | |
| 2012/0194190 A1* | 8/2012 | Goto | G01R 33/4833 324/309 |
| 2013/0154646 A1 | 6/2013 | Nitta et al. | |
| 2013/0187651 A1* | 7/2013 | Konta | G01R 33/5611 324/309 |
| 2013/0231578 A1 | 9/2013 | Takayanagi et al. | |
| 2013/0241555 A1* | 9/2013 | Obata | A61B 6/037 324/318 |
| 2013/0310923 A1 | 11/2013 | Kheradvar et al. | |
| 2015/0153434 A1 | 6/2015 | Ooshima | |
| 2016/0146917 A1* | 5/2016 | Wheaton | G01R 33/5659 324/309 |
| 2016/0154074 A1* | 6/2016 | Okamoto | G01R 33/5659 324/322 |

FOREIGN PATENT DOCUMENTS

| | | |
|---|---|---|
| JP | 2003-225225 A | 8/2003 |
| JP | 2006-055641 | 3/2006 |
| JP | 4018303 | 9/2007 |
| JP | 2007-534411 | 11/2007 |
| JP | 2010-527729 A | 8/2010 |

OTHER PUBLICATIONS

Office Action dated Jun. 13, 2014 in CN 201210447830.X with English translation.
Office Action dated Feb. 10, 2015 in CN 201210447830.X.
Office Action mailed Sep. 1, 2015 in JP Application No. 2011-247995.
Office Action dated Nov. 8, 2016 in JP 2015-213308.

* cited by examiner

FIG.18
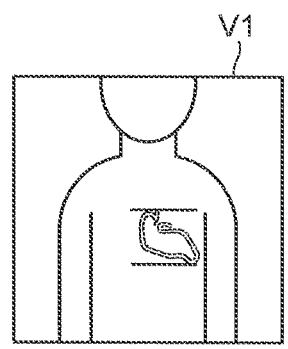
FIG.19A    FIG.19B    FIG.19C
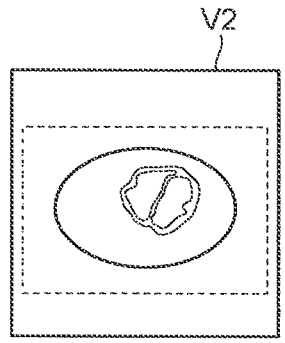 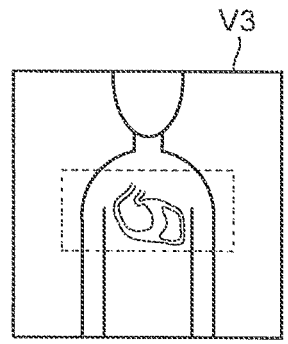 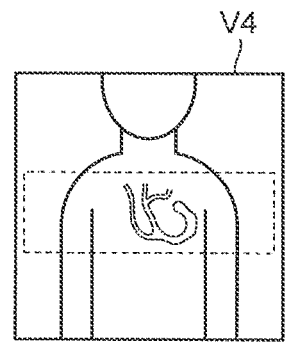

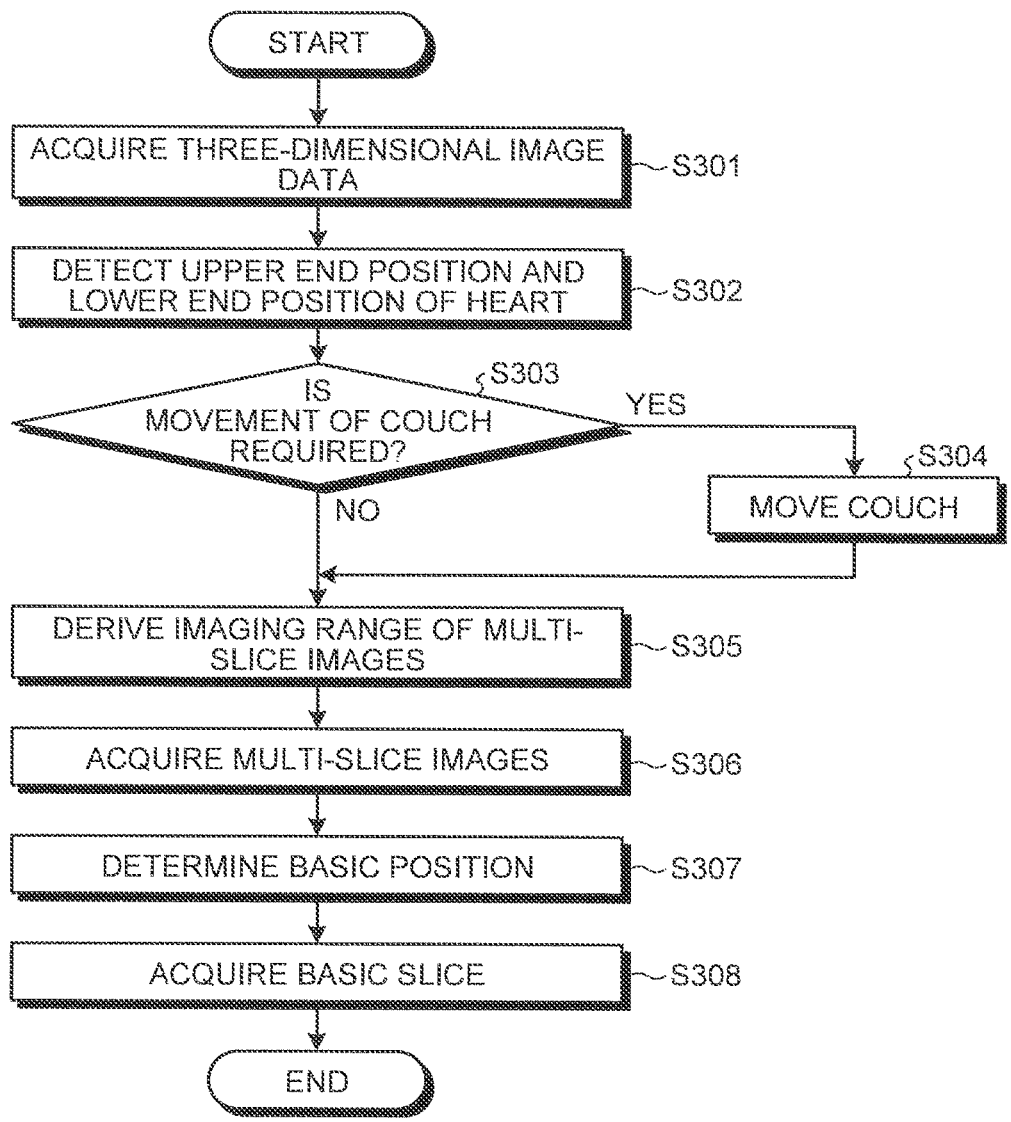

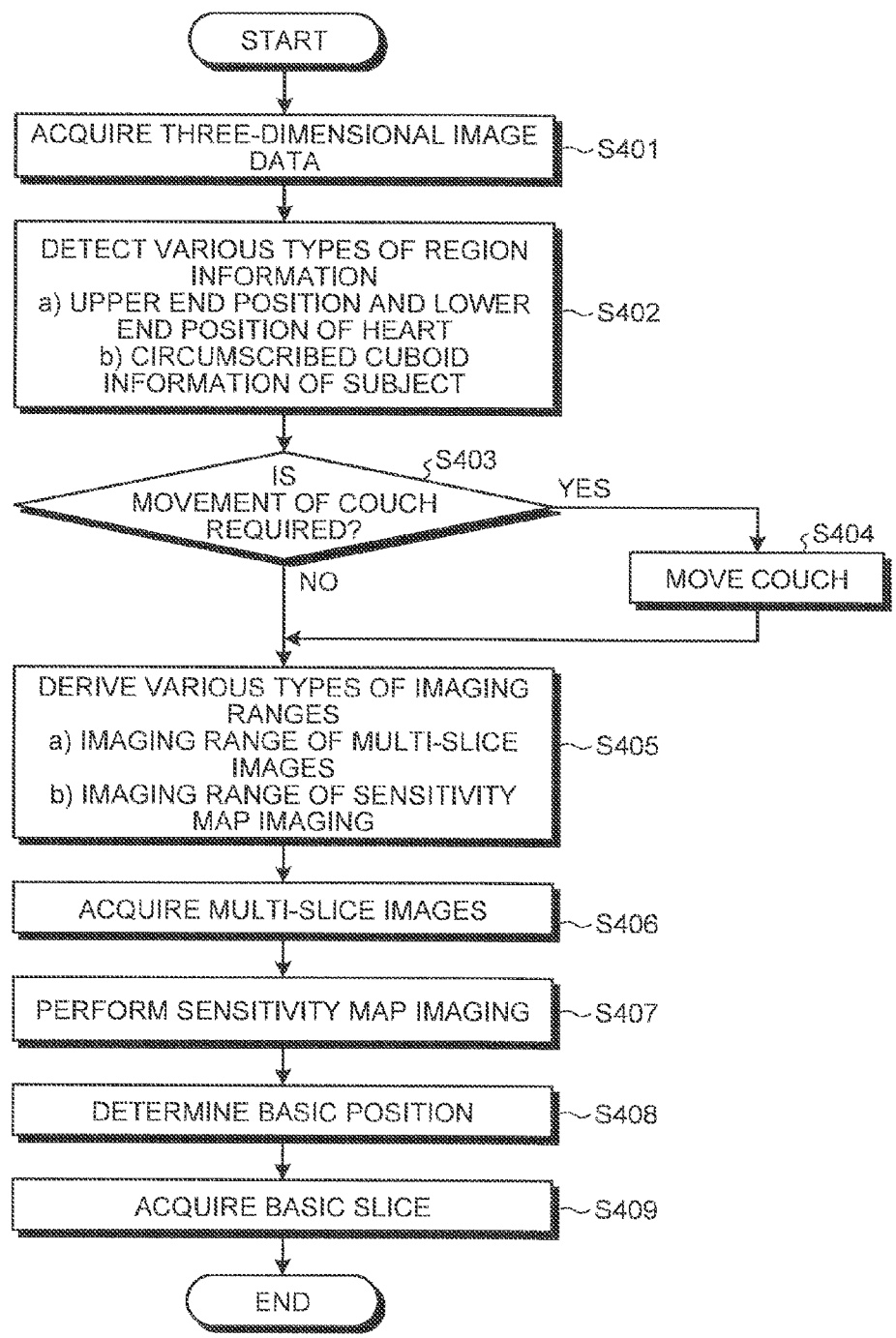

US 9,746,535 B2

MAGNETIC RESONANCE IMAGING APPARATUS

CROSS-REFERENCE TO RELATED APPLICATION

This application is a Divisional of U.S. patent application Ser. No. 13/670,875 filed Nov. 7, 2012 which claims priority to JP Patent Application No. 2011-247995 filed Nov. 11, 2011, the entire contents of each of which are hereby incorporated by reference.

FIELD

Embodiments described herein relate generally to a magnetic resonance imaging apparatus.

BACKGROUND

Conventionally, a standardized protocol has been established for a cardiac examination method by magnetic resonance imaging (MRI). The standardized protocol stipulates that scout views (an axial slice (an axial view), a sagittal slice (a sagittal view), and a coronal slice (a coronal view)) are acquired before multi-slice images serving as a plurality of axial views are acquired, and a basic slice is then acquired, for example. A basic slice is a section view based on anatomical characteristics of a heart and includes a vertical long-axis view, a horizontal long-axis view, a two-chamber long-axis (2-chamber) view, a three-chamber long-axis (3-chamber) view, a four-chamber long-axis (4-chamber) view, and a left ventricular short-axis view, for example.

To acquire multi-slice views, an imaging range needs to be set, for example. However, it is difficult even for a skilled operator to appropriately set a range covering the whole heart. Difficulty in setting of an imaging range is not limited to setting of an imaging range for multi-slice images and is not limited to the case where a target organ is a heart.

BRIEF DESCRIPTION OF THE DRAWINGS

FIG. 18 is a diagram of a confirmation screen for movement of a couch in the second embodiment;

FIGS. 19A to 19C are diagrams of confirmation screens for imaging ranges in the second embodiment;

FIG. 20 is a flowchart of a process according to a third embodiment;

FIG. 21 is a flowchart of a process according to a fourth embodiment; and

DETAILED DESCRIPTION

A magnetic resonance imaging apparatus according to an embodiment includes an acquiring unit, a detecting unit, a deriving unit, and an imaging controller. The acquiring unit acquires three-dimensional image data including a target organ. The detecting unit detects an upper end position and a lower end position of the target organ in the three-dimensional image data. The deriving unit derives an imaging range of subsequent imaging performed after acquisition of the three-dimensional image data based on the upper end position and the lower end position of the target organ. The imaging controller controls performance of the subsequent imaging in accordance with the imaging range.

First Embodiment

Figure 1:
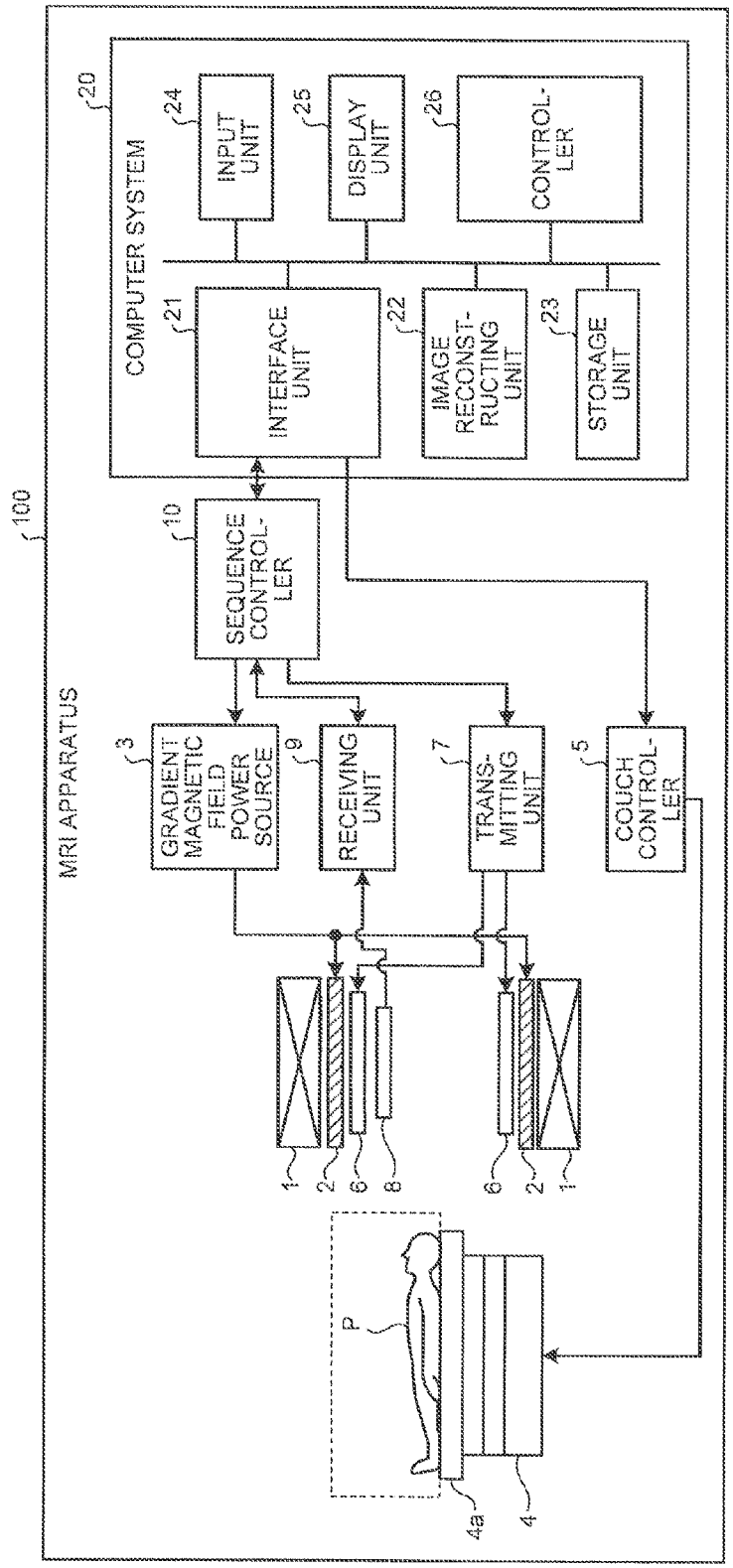
FIG. 1 is a block diagram of an MRI apparatus according to a first embodiment.

FIG. 1 is a block diagram of a magnetic resonance imaging (MRI) apparatus 100 according to a first embodiment. A subject P (a portion within a dotted frame in FIG. 1) is not included in the MRI apparatus 100. A magnetostatic field magnet 1 is formed in a hollow cylindrical shape and generates a uniform magnetostatic field in a space inside thereof. The magnetostatic field magnet 1 is a permanent magnet or a superconducting magnet, for example. A gradient coil 2 is formed in a hollow cylindrical shape and generates a gradient magnetic field in a space inside thereof. Specifically, the gradient coil 2 is arranged inside of the magnetostatic field magnet 1 and receives a gradient magnetic field pulse supplied from a gradient magnetic field power source 3 to generate a gradient magnetic field. The gradient magnetic field power source 3 supplies a gradient magnetic field pulse to the gradient coil 2 in accordance with a control signal transmitted from a sequence controller 10.

A couch 4 includes a couchtop 4a on which the subject P is placed and inserts the couchtop 4a into the hollow of the gradient coil 2 serving as an imaging entrance with the subject P placed on the couchtop 4a. The couch 4 is usually arranged such that the longitudinal direction thereof is parallel to a central axis of the magnetostatic field magnet 1. A couch controller 5 drives the couch 4 to move the couchtop 4a in the longitudinal direction and the vertical direction.

A transmitting coil 6 generates a magnetic field. Specifically, the transmitting coil 6 is arranged inside of the gradient coil 2 and receives a radio frequency (RF) pulse supplied from a transmitting unit 7 to generate a magnetic field. The transmitting unit 7 supplies an RF pulse corresponding to Larmor frequency to the transmitting coil 6 in accordance with a control signal transmitted from the sequence controller 10.

A receiving coil 8 receives a magnetic resonance signal (hereinafter, referred to as an MR signal). Specifically, the receiving coil 8 is arranged inside of the gradient coil 2 and receives an MR signal emitted from the subject P by an influence of a magnetic field. The receiving coil 8 outputs the MR signal thus received to a receiving unit 9.

The receiving unit 9 generates MR signal data based on the MR signal output from the receiving coil 8 in accordance with a control signal transmitted from the sequence controller 10. Specifically, the receiving unit 9 converts the MR signal output from the receiving coil 8 to a digital signal, thereby generating MR signal data. The receiving unit 9 then transmits the MR signal data thus generated to a computer system 20 via the sequence controller 10. The receiving unit 9 may be provided to a gantry apparatus including the magnetostatic field magnet 1 and the gradient coil 2, for example.

The sequence controller 10 controls the gradient magnetic field power source 3, the transmitting unit 7, and the receiving unit 9. Specifically, the sequence controller 10 transmits a control signal based on pulse sequence execution data transmitted from the computer system 20 to the gradient magnetic field power source 3, the transmitting unit 7, and the receiving unit 9. The sequence controller 10 is an integrated circuit, such as an application specific integrated circuit (ASIC) and a field programmable gate array (FPGA), or an electronic circuit, such as a central processing unit (CPU) and a micro processing unit (MPU), for example.

The computer system 20 includes an interface unit 21, an image reconstructing unit 22, a storage unit 23, an input unit 24, a display unit 25, and a controller 26. The interface unit 21 is connected to the sequence controller 10 and controls input and output of data transmitted and received by the sequence controller 10 and the computer system 20. The image reconstructing unit 22 reconstructs image data from MR signal data transmitted from the sequence controller 10 and stores the image data thus reconstructed in the storage unit 23.

The storage unit 23 stores therein image data stored by the image reconstructing unit 22 and other data used in the MRI apparatus 100. The storage unit 23 is a semiconductor memory device, such as a random access memory (RAM) and a flash memory, a hard disk, or an optical disk, for example.

The input unit 24 receives various types of instructions from an operator. The input unit 24 is a mouse and a keyboard, for example. The display unit 25 displays image data, for example. The display unit 25 is a liquid crystal display, for example.

The controller 26 controls the units described above, thereby collectively controlling the MRI apparatus 100. The controller 26 is an integrated circuit, such as an ASIC and a FPGA, or an electronic circuit, such as a CPU and an MPU, for example. The controller 26 includes units for automatically deriving an imaging range as will be described later.

Figure 2:
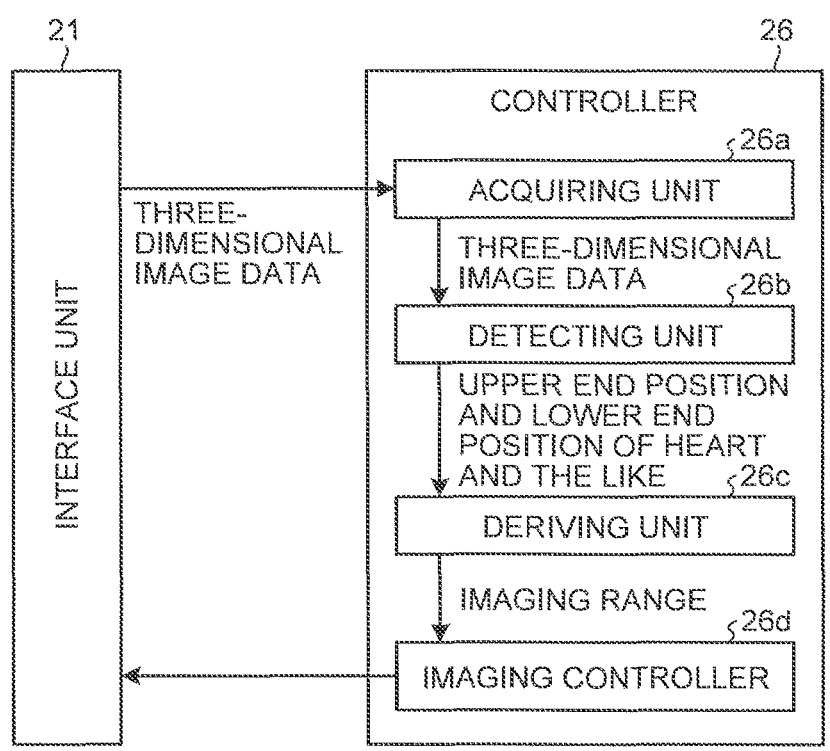
FIG. 2 is a block diagram of a controller and other components according to the first embodiment.

FIG. 2 is a block diagram of the controller 26 and other components according to the first embodiment. As illustrated in FIG. 2, the controller 26 according to the first embodiment includes an acquiring unit 26a, a detecting unit 26b, a deriving unit 26c, and an imaging controller 26d.

The acquiring unit 26a acquires three-dimensional image data in a range including the heart of the subject P. Specifically, the acquiring unit 26a controls units including the sequence controller 10 via the interface unit 21, thereby acquiring three-dimensional image data. The acquiring unit 26a then outputs the three-dimensional image data thus acquired to the detecting unit 26b.

The detecting unit 26b detects region information related to the heart (e.g., an upper end position and a lower end position of the heart) from three-dimensional image data. Specifically, the detecting unit 26b detects region information related to the heart in the three-dimensional image data output from the acquiring unit 26a and outputs the region information thus detected to the deriving unit 26c.

The deriving unit 26c derives an imaging range of subsequent imaging subsequent to acquisition of three dimensional image data based on region information related to the heart. Specifically, the deriving unit 26c derives an imaging range of subsequent imaging based on the region information related to the heart output from the detecting unit 26b and outputs the imaging range thus derived to the imaging controller 26d. In this case, the deriving unit 26c derives an imaging range corresponding to the type of subsequent imaging. In the first embodiment, the subsequent imaging means different types of multiple preliminary imaging performed before main imaging, and the main imaging (imaging for acquiring a basic slice). Examples of the different types of multiple preliminary imaging performed before the main imaging include imaging for acquiring multi-slice images, sensitivity map imaging for acquiring data indicating receiving sensitivity distribution of a receiving coil if the receiving coil (RF coil) is a multi-coil, and shimming imaging (shimming scan) for acquiring at least data used for homogeneity correction of magnetostatic field intensity. Because multi-slice images can function as information supporting the main imaging as will be described later, the imaging for acquiring multislice images may be referred to as "support imaging".

The imaging controller 26d controls performance of subsequent imaging in accordance with an imaging range. Specifically, the imaging controller 26d controls units including the sequence controller 10 via the interface unit 21 in accordance with the imaging range output from the deriving unit 26c, thereby controlling performance of subsequent imaging. Furthermore, the imaging controller 26d performs control such that multiple subsequent imaging is successively performed.

Figure 3:
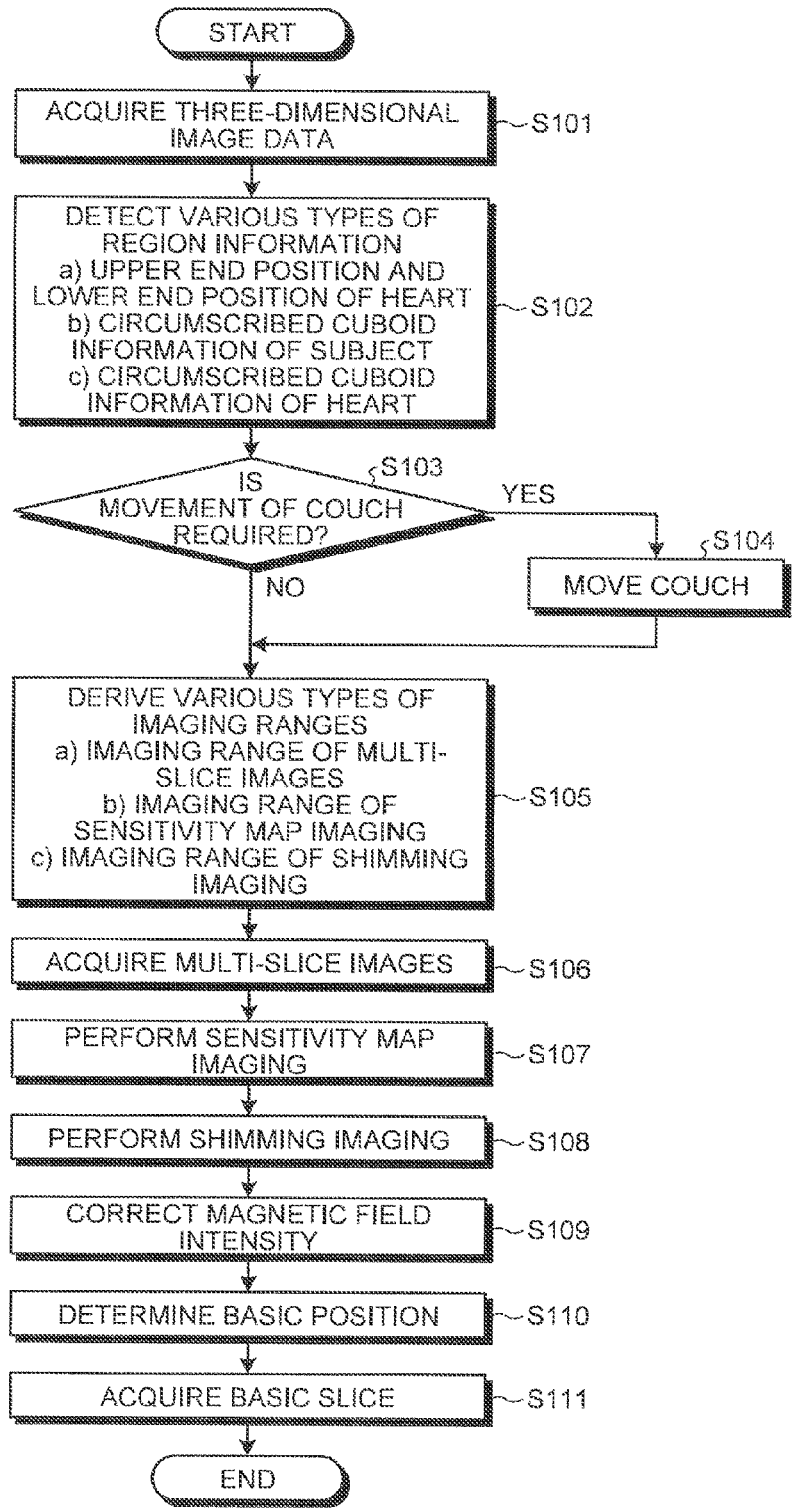
FIG. 3 is a flowchart of a process according to the first embodiment.

FIG. 3 is a flowchart of a process according to the first embodiment. As illustrated in FIG. 3, when detecting various types of region information from three-dimensional image data acquired previously, the MRI apparatus 100 according to the first embodiment automatically derives various types of imaging ranges based on the various types of region information thus detected and automatically performs subsequent imaging subsequent thereto. In other words, in the first embodiment, after three-dimensional image data is acquired, all the imaging including imaging for acquiring multi-slice images, sensitivity map imaging, shimming imaging, and imaging of a basic slice serving as main imaging is performed automatically. In the first embodiment, imaging ranges of various types of subsequent imaging are derived within a range of the three-dimensional image data acquired previously. Each step will be described below in detail.

Figure 4:
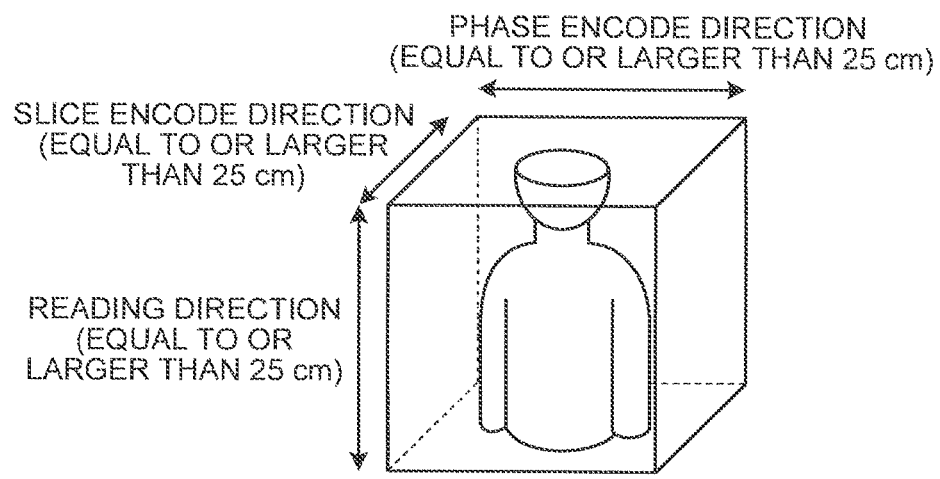
FIG. 4 is a diagram of three-dimensional image data in the first embodiment.

The acquiring unit 26a acquires three-dimensional image data in a range including the heart of the subject P (Step S101). FIG. 4 is a diagram of the three-dimensional image data in the first embodiment. As illustrated in FIG. 4, the acquiring unit 26a acquires the three-dimensional image data with a reading direction set as a superior-inferior direction, a phase encode direction set as a left-right direction, and a slice encode direction set as an anterior-posterior direction. As will be described later, in the first embodiment, the detecting unit 26b detects an upper end position and a lower end position of the heart in the superior-inferior direction in the three-dimensional image data. For this reason, it is preferable that high resolution in the superior-inferior direction be achieved, that is, the matrix size be made large. Therefore, the acquiring unit 26a acquires the three-dimensional image data with the reading direction set as the superior-inferior direction. Because resolution is increased by setting the reading direction as the superior-inferior direction in this method, the number of imaging need not be increased and imaging time, that is, time during which the subject is holding his or her breath is not increased.

Furthermore, as illustrated in FIG. 4, the acquiring unit 26a acquires the three-dimensional image data in an imaging range of equal to or larger than 25 cm on sides in the superior-inferior direction, the left-right direction, and the anterior-posterior direction centering around a magnetic field center position. Because the three-dimensional image data is acquired prior to other imaging, it is unpredictable at which position and in which size the heart of the subject is positioned in the three-dimensional image data. Therefore, it is required to set the imaging range large to some extent. In this respect, because the size of the heart is expected to be approximately 13 cm in the superior-inferior direction, the imaging range in the first embodiment is set to equal to or larger than 25 cm, which is approximately twice the size of the heart. If the subject is a little child, the size of the heart is also expected to be small. Therefore, the size of the imaging range may be set to equal to or larger than 20 cm, for example. The size of the imaging range can be arbitrarily changed. Furthermore, the upper limit of the imaging range can be considered as the maximum value (e.g., a range with which homogeneity of the magnetostatic field intensity can be ensured) of field of view (FOV) settable by the MRI apparatus 100, for example.

The three-dimensional image data may be three-dimensional MR image generated by three-dimensional reconstruction or a plurality of two-dimensional MR images (in the reading direction and the phase encode direction).

A pulse sequence used for acquiring the three-dimensional image data in the first embodiment will now be described. The acquiring unit 26a uses a gradient echo (GE) pulse sequence to acquire the three-dimensional image data. Because the GE pulse sequence is a method for acquiring an MR signal by an excitation pulse and a gradient magnetic field pulse at a small flip angle, the GE pulse sequence can reduce repetition time (TR) compared with a spin echo (SE) pulse sequence. The acquiring unit 26a uses a 3D fast field echo (FFE) sequence and a 3D steady-state free precession (SSFP) sequence, for example. Furthermore, while the imaging time is extended, the acquiring unit 26a may add a pulse sequence for applying a T2 preparation pulse prior to the 3D FFE sequence and the 3D SSFP sequence. Application of the T2 preparation pulse can enhance contrast of an image.

In the case of the 3D FFE sequence, various types of parameters are set based on time during which the subject can hold his or her breath, for example. The parameters are set to TR/TE (echo time)=3.7/1.3 (ms) out of synchronism with electrocardiogram (ECG) and 92 to 96 (phase encode direction)×256 to 366 (read direction)×30 to 40 (slice direction), for example.

In terms of MRI, there has been developed a half scan method for estimating an MR signal in a yet-to-be acquired region by mathematical processing using complex conjugate property without acquiring an MR signal in some regions. The acquiring unit 26a may also apply the half scan method to either the phase encode direction or the slice encode direction or the both, for example.

Alternatively, the acquiring unit 26a may acquire the three-dimensional image data by performing multi-slice imaging (an axial view, a sagittal view, a coronal view, or a combination thereof) using a 2D FFE sequence and a 2D SSFP sequence in synchronism with ECG. In this case, various types of parameters are set to TR/TE=3.4/1.7 (ms), 128 to 192 (phase encode direction)×256 (read direction), and 20 multi slices, for example.

The detecting unit 26b then detects various types of region information in the three-dimensional image data (Step S102). Specifically, in the first embodiment, the detecting unit 26b detects various types of region information a) to c):

a) an upper end position and a lower end position of the heart
b) a circumscribed cuboid region of the subject (the subject's body)
c) a circumscribed cuboid region of the heart "a) an upper end position and a lower end position of the heart" is used for derivation of an imaging range of imaging for acquiring multi-slice images and determination of whether the couch 4 needs to be moved. "b) a circumscribed cuboid region of the subject" is used for derivation of an imaging range of sensitivity map imaging. "c) a circumscribed cuboid region of the heart" is used for derivation of an imaging range of shimming imaging. Because "a) an upper end position and a lower end position of the heart" is included in "c) a circumscribed cuboid region of the heart", the detecting unit 26b may combine detection of "a) an upper end position and a lower end position of the heart" and detection of "c) a circumscribed cuboid region of the heart".

Figure 5:
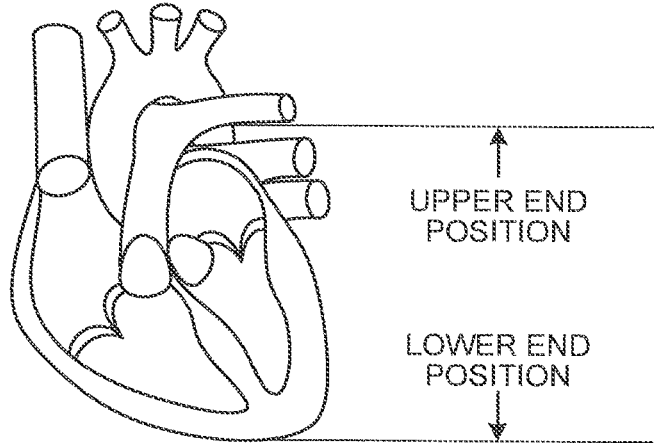
FIG. 5 is a diagram illustrating an upper end position and a lower end position in the first embodiment.

FIG. 5 is a diagram illustrating an upper end position and a lower end position in the first embodiment. As described above, "a) an upper end position and a lower end position of the heart" is used for derivation of an imaging range of imaging for acquiring multi-slice images. The imaging range for multi-slice images, in particular, the imaging range covering the superior-inferior direction is preferably set so as to include the whole heart. A lower end portion of the heart has a relationship with a characteristic region for deriving an important axis for positioning of a basic slice, for example. Therefore, if the imaging range of multi-slice images fails to cover the lower end portion of the heart, re-imaging is required, thereby imposing a burden on both the subject and the operator.

The detecting unit 26b applies a technology, such as template matching or pattern recognition, to the three-dimensional image data acquired at Step S101, thereby detecting an upper end position and a lower end position of the heart in the three-dimensional image data.

If the upper end position of the heart is detected by applying the technology of template matching, for example, the detecting unit 26b prepares in advance an average image pattern around the bifurcation of the pulmonary artery, uses the average image pattern to scan the three-dimensional image data, and determines a height at which the matching degree is the highest to be the upper end position of the heart. Furthermore, if the lower end position of the heart is detected by applying the technology of pattern recognition, for example, the detecting unit 26b acquires patterns of a region around the left ventricular apex and of other regions from a plurality of pieces of actual data and establishes a discriminator, such as a support vector machine, in advance. The detecting unit 26b then cuts out each position in a target image and inputs the position to the discriminator, thereby determining whether the position is the left ventricular apex.

The method for detecting the upper end position and the lower end position of the heart is not limited thereto. The upper end position of the heart may be detected by applying the technology of pattern recognition, and the lower end position of the heart may be detected by applying the technology of template matching, for example. Furthermore, the regions focused to detect the upper end position and the lower end position of the heart are not limited to the bifurcation of the pulmonary artery and the left ventricular apex. Alternatively, the aorta, the pulmonary artery, the diaphragm, and the spleen may be focused, for example. Furthermore, the technology is not limited to template matching and pattern recognition, and an approach based on registration and segmentation, which will be described later, may be employed.

Figure 6:
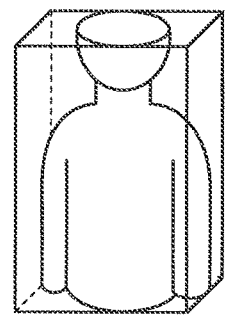
FIG. 6 is a diagram of a circumscribed cuboid region of a subject in the first embodiment.
Figure 7A:
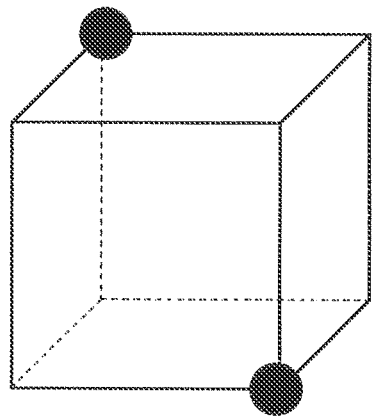
FIGS. 7A and 7B are diagrams for explaining the circumscribed cuboid region in the first embodiment.
Figure 7B:
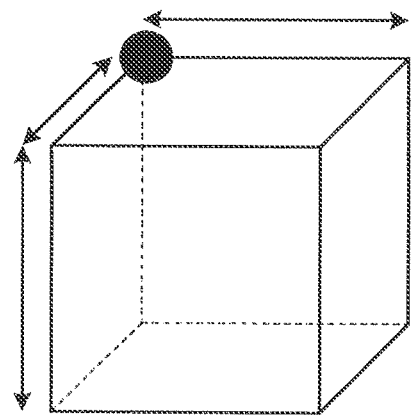

Furthermore, the detecting unit 26b detects a cuboid region circumscribing the subject in the three-dimensional image data acquired at Step S101 as illustrated in FIG. 6, for example. FIG. 6 is a diagram of the circumscribed cuboid region of the subject in the first embodiment. FIGS. 7A and 7B are diagrams for explaining the circumscribed cuboid region in the first embodiment. As illustrated in FIG. 7A, information of the cuboid region (hereinafter, referred to as "circumscribed cuboid information") is represented by two points in a diagonal relationship of the cuboid. The embodiment is not limited thereto, and the circumscribed cuboid information may be represented by an arbitrary point and the lengths of three sides of the cuboid as illustrated in FIG. 7B.

The detecting unit 26b, for example, extracts a region of the subject (or an air region that is not the region of the subject) by threshold processing and labeling processing, such as region expansion, thereby detecting a circumscribed cuboid region of the subject. Alternatively, the detecting unit 26b, for example, performs threshold processing on one-dimensional profiles obtained by projecting a luminance value in the superior-inferior direction, the left-right direction, and the anterior-posterior direction based on the average value and the maximum value, thereby detecting the circumscribed cuboid region of the subject.

Figure 8:
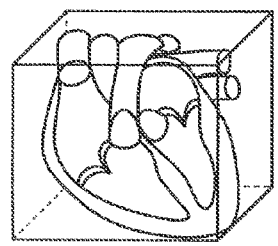
FIG. 8 is a diagram of a circumscribed cuboid region of a heart in the first embodiment.

Furthermore, the detecting unit 26b detects a cuboid region circumscribing the heart in the three-dimensional image data acquired at Step S101 as illustrated in FIG. 8, for example. FIG. 8 is a diagram of the circumscribed cuboid region of the heart in the first embodiment. The detecting unit 26b, for example, prepares in advance a model image in which the heart is located at the known position. The detecting unit 26b then performs registration for rigidly deforming or non-rigidly deforming the model image such that image patterns of the model image and the three-dimensional image data coincide with each other, thereby detecting the circumscribed cuboid region of the heart. The detecting unit 26b, for example, calculates Equation (1) to derive an image deformation parameter, thereby performing the registration.

$$\hat{g} = \underset{g}{\operatorname{argmin}}(E(I(i), M(g(i)))) \quad (1)$$

In Equation (1), "i" represents a position vector of an image, "I(i)" represents a pixel value of the three-dimensional image data at the position i, and "M(i)" represents a pixel value of the model image at the position i. Function "E" is an evaluation function for the similarity between the three-dimensional image data and the model image. Function "E" produces a lower value as the three-dimensional image data and the model image are more similar to each other and is realized by summation of square errors of corresponding pixels, for example. Function "g" is a function of rigid deformation, such as Affine deformation, or a function of non-rigid deformation, such as Thin-Plate-Spline deformation.

Furthermore, the detecting unit 26b, for example, segments the three-dimensional image data into an air region and a region other than the air region by threshold processing. The detecting unit 26b then applies a diaphragm surface model and a spherical model simulating the heart to the boundary of the air region, thereby detecting the circumscribed cuboid information of the heart.

After the detection of various types of information performed by the detecting unit 26b is completed, the imaging controller 26d controls movement of the couch 4 (or the couchtop 4a) based on the upper end position and the lower end position of the heart detected at Step S102 and the magnetic field center position prior to start of the subsequent imaging. The imaging controller 26d, for example, determines whether the magnetic field center position is located at an intermediate position between the upper end position and the lower end position of the heart, thereby determining whether the couch 4 needs to be moved (Step S103). If the magnetic field center position and the intermediate position do not coincide with each other, the imaging controller 26d determines that the couch 4 needs to be moved (Yes at Step S103). Subsequently, by controlling the couch controller 5 with a distance from the magnetic field center position to the intermediate position as a movement amount, the imaging controller 26d controls movement of the couch 4 (Step S104).

By contrast, if the magnetic field center position and the intermediate position coincide with each other, the imaging controller 26d determines that the couch 4 need not be moved (No at Step S103), and the system control goes to Step S105. Determination of whether the couch 4 needs to be moved is not limited to the method described above. If the distance from the magnetic field center position to the intermediate position exceeds a predetermined threshold, the imaging controller 26d may determine that the couch 4 needs to be moved, for example. Alternatively, if the magnetic field center position is not located between the upper end position and the lower end position of the heart, the imaging controller 26d may determine that the couch 4 needs to be moved, for example. While the explanation has been made of the example where the system control goes to Step S105 after the movement of the couch 4 in the first embodiment, the embodiment is not limited thereto. After the movement of the couch 4, for example, the system control may be returned to Step S101 to reacquire three-dimensional image data and redetect various types of region information.

Figure 9:
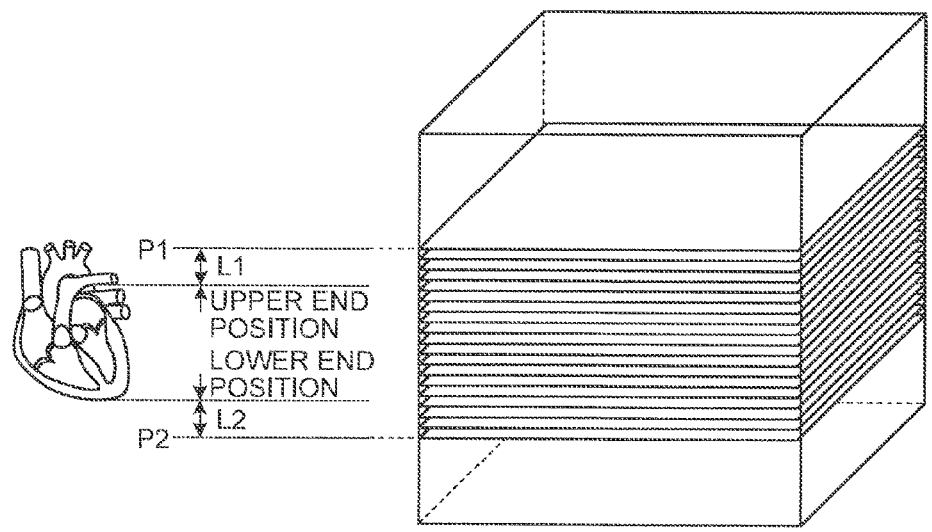
FIG. 9 is a diagram for explaining an imaging range in the first embodiment.
Figure 10:
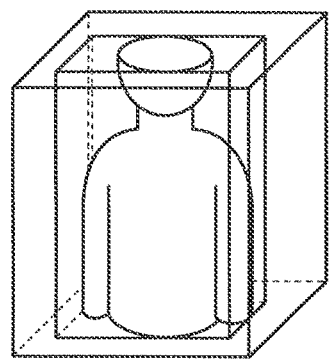
FIG. 10 is a diagram for explaining an imaging range in the first embodiment.
Figure 11:
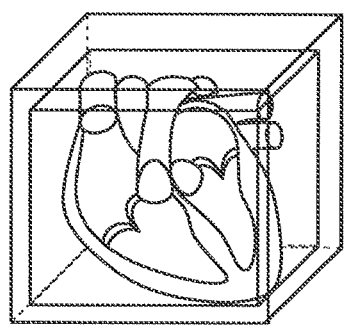
FIG. 11 is a diagram for explaining an imaging range in the first embodiment.

If adjustment of the couch position is completed, the deriving unit 26c derives imaging ranges of various types of subsequent imaging based on the various types of region information detected at Step S102 (Step S105). Specifically, the deriving unit 26c derives imaging ranges of various types of subsequent imaging a) to c):
a) imaging for acquiring multi-slice images
b) sensitivity map imaging
c) shimming imaging The deriving unit 26c derives an imaging range of imaging for acquiring multi-slice images based on "a) an upper end position and a lower end position of the heart" detected at Step S102. FIG. 9 to FIG. 11 are views for explaining the imaging ranges in the first embodiment. As illustrated in FIG. 9, for example, the deriving unit 26c derives a range including the upper end position and the lower end position of the heart, that is, a range between a position P1 obtained by taking a predetermined offset L1 from the upper end position of the heart in the head direction and a position P2 obtained by taking a predetermined offset L2 from the lower end position of the heart in the foot direction as an imaging range in the slice direction.

The deriving unit 26c may use fixed values or variable values that differ depending on the subject P for the lengths of the offsets L1 and L2. The deriving unit 26c may acquire in advance information indicating the figure of the subject P, such as the height and the weight, and information, such as the age, the sex, the heart rate, the pulse rate, the medical history, the exercise history, and the smoking history of the subject P, and time during which the subject P can hold his or her breath, for example. Based on these pieces of information, the deriving unit 26c may change the lengths of the offsets L1 and L2. Furthermore, the deriving unit 26c may change the lengths of the offsets L1 and L2 by receiving setting of settable information from the operator, for example.

The deriving unit 26c simply needs to use predetermined fixed values for an imaging range in the left-right direction and an imaging range in the anterior-posterior direction in the imaging range for acquiring multi-slice images so that the imaging ranges at least include the heart, for example. Alternatively, similarly to the imaging range in the superior-inferior direction, the deriving unit 26c may use variable values that differ depending on the subject P, for example. Still alternatively, the deriving unit 26c may derive the imaging range in the left-right direction and the imaging range in the anterior-posterior direction based on "b) a circumscribed cuboid region of the subject" detected at Step S102, for example. The deriving unit 26c may derive the shorter side among the three sides included in the circumscribed cuboid information of the subject as an imaging range in the phase encode direction, for example. Furthermore, the deriving unit 26c may derive the imaging range in the phase encode direction such that the imaging range is larger than the cuboid region circumscribing the subject, for example. In this case, the imaging for acquiring multi-slice images can be performed for the shortest imaging time without influence of aliasing.

Subsequently, the deriving unit 26c derives an imaging range of sensitivity map imaging based on "b) a circumscribed cuboid region of the subject" detected at Step S102. As illustrated in FIG. 10, for example, the deriving unit 26c derives a range (an outer cuboid in FIG. 10) including the cuboid region circumscribing the subject, that is, a range larger than the cuboid region circumscribing the subject as the imaging range of sensitivity map imaging. A map acquired by sensitivity map imaging indicates spatial distribution of the receiving sensitivity of each element coil if the receiving coil 8 is a multi-coil and is used for parallel imaging, which is one of the high-speed imaging technologies, for example.

The deriving unit 26c then derives an imaging range of shimming imaging based on "c) a circumscribed cuboid region of the heart" detected at Step S102. As illustrated in FIG. 11, for example, the deriving unit 26c derives a range (an outer cuboid in FIG. 11) including the cuboid region circumscribing the heart as the imaging range of shimming imaging. The deriving unit 26c, for example, derives a range obtained by taking offsets of lengths in the superior-inferior direction, the left-right direction, and the anterior-posterior direction from the cuboid region circumscribing the heart as the imaging range of shimming imaging. The deriving unit 26c may use fixed values or variable values that differ depending on the subject P for the lengths of the offsets. The deriving unit 26c may acquire in advance information indicating the figure of the subject P, such as the height and the weight, and information, such as the age, the sex, the heart rate, the pulse rate, the medical history, the exercise history, and the smoking history of the subject P, and time during which the subject P can hold his or her breath, for example. Based on these pieces of information, the deriving unit 26c may change the lengths of the offsets. Furthermore, the deriving unit 26c may change the lengths of the offsets by receiving setting of settable information from the operator, for example.

In the first embodiment, shimming imaging is performed to adjust the homogeneity of the magnetostatic field. Specifically, data used for homogeneity correction of the magnetostatic field intensity (data reflecting influences of the magnetostatic field) is acquired, and a correction amount of the magnetostatic field (an offset magnetic field) is calculated based on the data thus acquired. Subsequently, a current value is determined in accordance with the correction amount thus calculated. By applying an electrical current of the current value to a correction coil (which is not illustrated in FIG. 1) (by applying the offset magnetic field), the homogeneity of the magnetostatic field is adjusted. If the data reflecting influences of the magnetostatic field includes data of a region other than the region to be diagnosed, the correction amount may possibly fail to be calculated appropriately. The magnetostatic field distribution of the heart region tends to be significantly different from that of the chest wall region. Therefore, if data of a region other than the heart region is included, an error may possibly occur in the correction amount thus calculated, thereby preventing appropriate adjustment. For this reason, the imaging range of shimming imaging is preferably set in a manner limiting to the vicinity of the target organ. In the first embodiment, by deriving a range obtained by taking offsets of the lengths from the cuboid region circumscribing the heart as the imaging range of shimming imaging, it is possible to appropriately limit the imaging range of shimming imaging to the vicinity of the target organ.

While the explanation has been made of the example where shimming imaging for acquiring data used for homogeneity correction of the magnetostatic field intensity is performed in the first embodiment, the embodiment is not limited thereto. The shimming imaging may further include acquisition of data used for determining the center frequency of an RF pulse. In this case, the acquisition of data used for determining the center frequency of an RF pulse is performed with the offset magnetic field applied. Furthermore, the acquisition of data used for determining the center frequency of an RF pulse alone may be performed without acquiring data used for homogeneity correction of the magnetostatic field intensity (frequency spectrum imaging for setting the center frequency). The frequency spectrum imaging may be performed by using only slices of the center portion in the imaging range of acquisition of data used for homogeneity correction of the magnetostatic field intensity as an imaging range. Alternatively, the frequency spectrum imaging may be performed by selective excitation using the whole imaging range of acquisition of data used for homogeneity correction of the magnetostatic field intensity as a voxel.

After the derivation of the imaging range performed by the deriving unit 26c is completed, the imaging controller 26d controls the subsequent imaging in accordance with the imaging range derived by the deriving unit 26c. The imaging controller 26d, for example, acquires multi-slice images in accordance with the imaging range of "a) imaging for acquiring multi-slice images" derived at Step S105 (Step S106). Furthermore, the imaging controller 26d performs sensitivity map imaging in accordance with the imaging range of "b) sensitivity map imaging" derived at Step S105 (Step S107). Moreover, the imaging controller 26d performs shimming imaging in accordance with the imaging range of "c) shimming imaging" derived at Step S105 (Step S108).

The imaging controller 26d then corrects the magnetic field intensity based on the data acquired by the shimming imaging at Step S108 (Step S109). Specifically, the imaging controller 26d calculates a correction amount of the magnetostatic field based on the data acquired by the shimming imaging at Step S108 to determine a current value in accordance with the correction amount thus calculated. The imaging controller 26d then controls each unit so as to apply an electrical current of the current value thus determined to the correction coil (which is not illustrated in FIG. 1), thereby adjusting the homogeneity of the magnetostatic field.

Subsequently, the imaging controller 26d determines a basic position serving as positional information for acquiring a basic slice used for diagnosis from the multi-slice images acquired at Step S106 (Step S110). The imaging controller 26d then acquires the basic slice based on the basic position thus determined (Step S111).

FIG. 12 to FIG. 15 are diagrams of the basic position and the basic slice in the first embodiment. While a four chamber long-axis view (or a four-chamber section view) is assumed in the first embodiment, the embodiment is not limited thereto.

Figure 12:
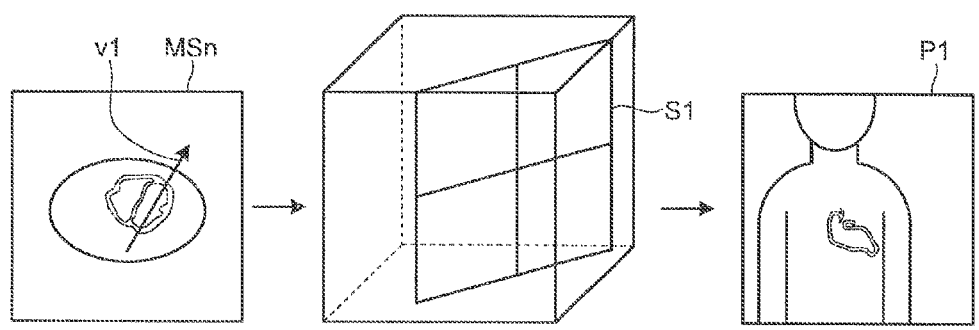
FIG. 12 is a diagram of a basic position and a basic slice in the first embodiment.

As illustrated in FIG. 12, for example, the imaging controller 26d selects an n-th image MSn from the multi-slice images acquired at Step S106 and determines a long-axis vector v1 passing through the center of the mitral valve and the ventricular apex from the image MSn thus selected as a basic position. The imaging controller 26d then sets and acquires a slice S1 that passes through the long-axis vector v1 thus determined and is parallel to the superior-inferior direction as a basic slice. An image P1 obtained by acquiring the basic slice S1 is referred to as a "vertical long-axis view".

Figure 13:
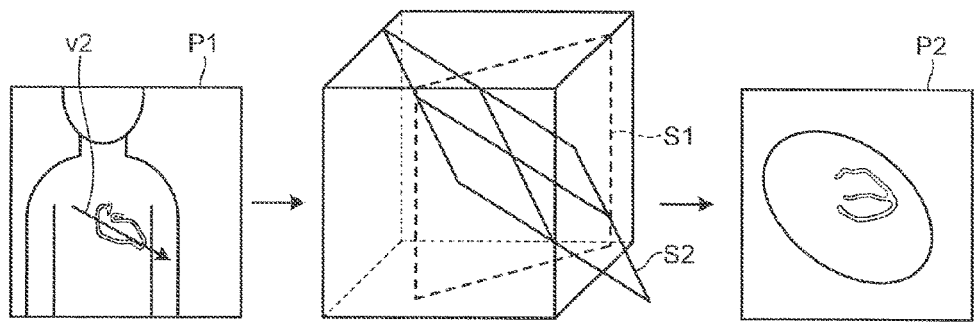
FIG. 13 is a diagram of a basic position and a basic slice in the first embodiment.

As illustrated in FIG. 13, for example, the imaging controller 26d determines a long-axis vector v2 passing through the center of the mitral valve and the ventricular apex from the image P1 as a basic position. The imaging controller 26d then sets and acquires a slice S2 that passes through the long-axis vector v2 thus determined and is orthogonal to the slice S1 as a basic slice. An image P2 obtained by acquiring the basic slice S2 is referred to as a "horizontal long-axis view".

Figure 14:
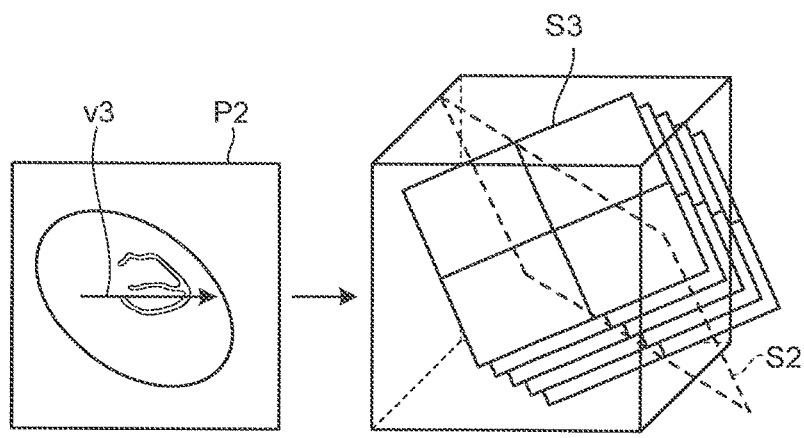
FIG. 14 is a diagram of a basic position and a basic slice in the first embodiment.

As illustrated in FIG. 14, for example, the imaging controller 26d determines a long-axis vector v3 passing through the center of the mitral valve and the ventricular apex from the image P2 as a basic position. The imaging controller 26d then sets and acquires a plurality of slices S3 orthogonal to both the long-axis vector v3 thus determined and the slice S2 as basic slices. Images obtained by acquiring the basic slices S3 are referred to as "left ventricular short-axis views".

Figure 15:
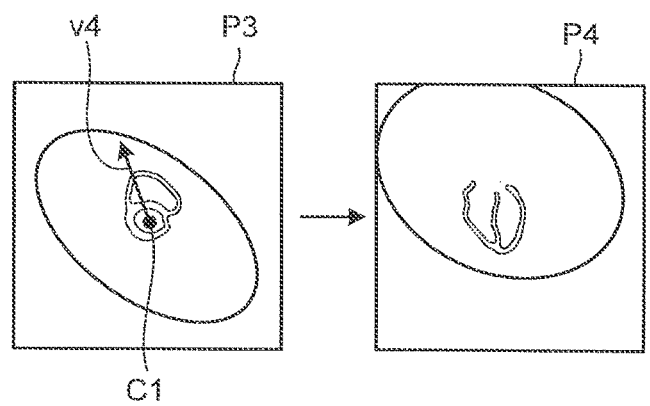
FIG. 15 is a diagram of a basic position and a basic slice in the first embodiment.

As illustrated in FIG. 15, for example, the imaging controller 26d determines a short-axis vector v4 passing through a center C1 of the left ventricle and a corner of the right ventricle from an arbitral left ventricular short-axis view closer to the base of the heart among the left ventricular short-axis views as a basic position. The imaging controller 26d then sets and acquires a slice that passes through the short-axis vector v4 thus determined and is orthogonal to the slice P3 as a basic slice. An image P4 obtained by acquiring the basic slice is referred to as a "four-chamber long-axis view".

The method for determining the basic position only needs to be a method for determining the basic slice uniquely, and a known technology can be employed for the method (refer to JP-A 2006-55641 (KOKAI), JP-A 2002-140689 (KOKAI), and Japanese Patent No. 4018303, for example). In a known method using the blood volume in the ventricle, for example, the imaging controller 26d selects a multi-slice view in which the blood volume in the ventricle is the maximum from the multi-slice images by image processing and identifies the apex position of the left ventricle using an image curvature technique and an image gradient technique. Furthermore, the imaging controller 26d generates a line between two opened apexes of the myocardium of the left ventricle, thereby identifying the base position. The imaging controller 26d then determines an axis passing and extending through the apex position and the base position as a basic position. The imaging controller 26d acquires a basic slice while determining other basic positions in the same manner.

In a known method in which a small area including a characteristic region is prepared as a dictionary image, for example, the imaging controller 26d prepares in advance a small area including a tissue, such as the mitral valve, the tricuspid valve, and the interventricular septum, and a junction as a dictionary image. The imaging controller 26d averages the luminance value in the small area for each region, thereby generating a dictionary image for the mitral valve and a dictionary image for the tricuspid valve, for example. The imaging controller 26d then searches for a portion highly similar to the dictionary image in the multi-slice images and identifies the characteristic region based on the type of the dictionary image determined to be highly similar thereto. Subsequently, the imaging controller 26d simply needs to determine a basic position using the characteristic region thus identified.

Alternatively, a manual method in which a basic slice is displayed on the display unit 25 as a preview to cause the operator to select the basic slice may be employed. While the explanation has been made of the example where, after the preliminary imaging, such as the acquisition of the multislice images, the sensitivity map imaging, and the shimming imaging, is automatically performed, the basic position is automatically determined, and the basic slice is automatically acquired, that is, the example where the processing to the main imaging is automatically performed, the embodiment is not limited thereto. After the preliminary imaging is performed, for example, the basic position may be determined using the multi-slice images thus acquired, and a basic slice for confirmation and a screen for confirmation of the position of the basic slice on another image may be generated from the multi-slice images thus acquired and be temporarily displayed on the display unit 25 as a preview. The operator can check the basic slice and the like displayed as a preview on the display unit 25. Under the condition that the operator inputs confirmation, the imaging controller 26d starts imaging of the basic slice serving as the main imaging. In this case, the multi-slice images can function as information supporting the main imaging. Furthermore, in this case, the subsequent imaging in which the imaging range is automatically derived does not include the main imaging but includes different types of multiple preliminary imaging performed before the main imaging.

As described above, according to the first embodiment, the upper end position and the lower end position of the heart are detected in the three-dimensional image data, and the imaging range of the multi-slice images is derived based on the upper end position and the lower end position of the heart thus detected. Therefore, it is possible to facilitate setting of the imaging range of the multi-slice images.

In other words, it is preferable that the imaging range of the multi-slice images be set such that the imaging range includes a region other than the heart as little as possible in the superior-inferior direction while including the whole heart. To image the multi-slice images in a large range in the superior-inferior direction, the number of imaging needs to be increased or the imaging interval needs to be lengthened. In the former case, time during which the subject is holding his or her breath is increased. In the latter case, spatial resolution in the superior-inferior direction is reduced. While an axial view, a sagittal view, and a coronal view have been conventionally imaged as a scout view, the heart visualized in the scout view may possibly differ every time because of individual differences in the shape, the position, and the direction of the heart, influences of the heart rate, and other factors. As a result, it is difficult even for a skilled operator to accurately derive a range covering the whole heart. In this respect, according to the first embodiment, not three orthogonal views but three-dimensional image data is acquired, the upper end position and the lower end position of the heart are detected in the three-dimensional image data, and the imaging range of the multi-slice images is automatically derived. Therefore, it is possible to facilitate accurate setting of the imaging range of the multi-slice images that is difficult even for a skilled operator.

According to the first embodiment, besides the imaging range of the multi-slice images, the imaging range of sensitivity map imaging and the imaging range of shimming imaging are automatically derived based on the region information of the heart detected in the three-dimensional image data. Therefore, it is possible to facilitate setting of various types of imaging ranges. Furthermore, because the imaging range of shimming imaging is derived based on the circumscribed cuboid information of the heart, it is possible to set the imaging range of shimming imaging stably and accurately.

The relationship between the imaging range with which the three-dimensional image data is acquired and the imaging ranges of various types of preliminary imaging (the imaging range of imaging for acquiring the multi-slice images, the imaging range of sensitivity map imaging, and the imaging range of shimming imaging) will now be described. The imaging range of shimming imaging, which is derived as a range obtained by taking offsets of the lengths from the cuboid region circumscribing the heart, is the smallest among these imaging ranges. The imaging range of imaging for acquiring the multi-slice images is equal to or larger than the imaging range of shimming imaging. The imaging range of sensitivity map imaging is larger than the imaging range of imaging for acquiring the multi-slice images. The imaging range with which the three-dimensional image data is acquired is still larger than the imaging range of sensitivity map imaging.

In other words, if shimming imaging is included in the multiple subsequent imaging, the deriving unit 26c derives the imaging range of shimming imaging larger than the region information. If imaging for acquiring the multi-slice images is included in the multiple subsequent imaging, the deriving unit 26c derives the imaging range of imaging for acquiring the multi-slice images equal to or larger than the imaging range of shimming imaging. If sensitivity map imaging is included in the multiple subsequent imaging, the deriving unit 26c derives the imaging range of sensitivity map imaging larger than the imaging range of imaging for acquiring the multi-slice images.

The process explained in the first embodiment can be arbitrarily changed. The sensitivity map imaging may be performed after acquisition of the basic slice, for example. This is because the sensitivity map acquired by the sensitivity map imaging only needs to be acquired before the stage for reproducing an image.

Furthermore, acquisition of the three-dimensional image data and the sensitivity map imaging may be combined, for example. In this case, one of the imaging can be omitted, which contributes to reduction in the imaging time. Furthermore, the imaging time may be reduced by combining other types of imaging.

While the processing in the first embodiment is started from the processing for acquiring the three-dimensional image data (Step S101), the embodiment is not limited thereto. Before the acquisition processing of the three-dimensional image data is started, the imaging controller 26d may receive selection of the types of preliminary imaging subsequent thereto and specification of their order, for example, and may perform control so as to perform the preliminary imaging of the types thus received in the order thus received. In the example of the first embodiment, it is assumed that the imaging controller 26d receives selection of imaging for acquiring the multi-slice images, sensitivity map imaging, and shimming imaging as the preliminary imaging at Step S100 and receives specification of performance of the preliminary imaging in this order, for example.

Second Embodiment

Similarly to the first embodiment, an MRI apparatus 100 according to a second embodiment acquires three-dimensional image data, automatically derives an imaging slice of subsequent imaging, and sequentially performs various types of subsequent imaging. However, the MRI apparatus 100 according to the second embodiment is different from that of the first embodiment in that the MRI apparatus 100 displays a confirmation screen as needed and performs processing after receiving a confirmation. Differences from the first embodiment will be mainly explained below.

Figure 16:
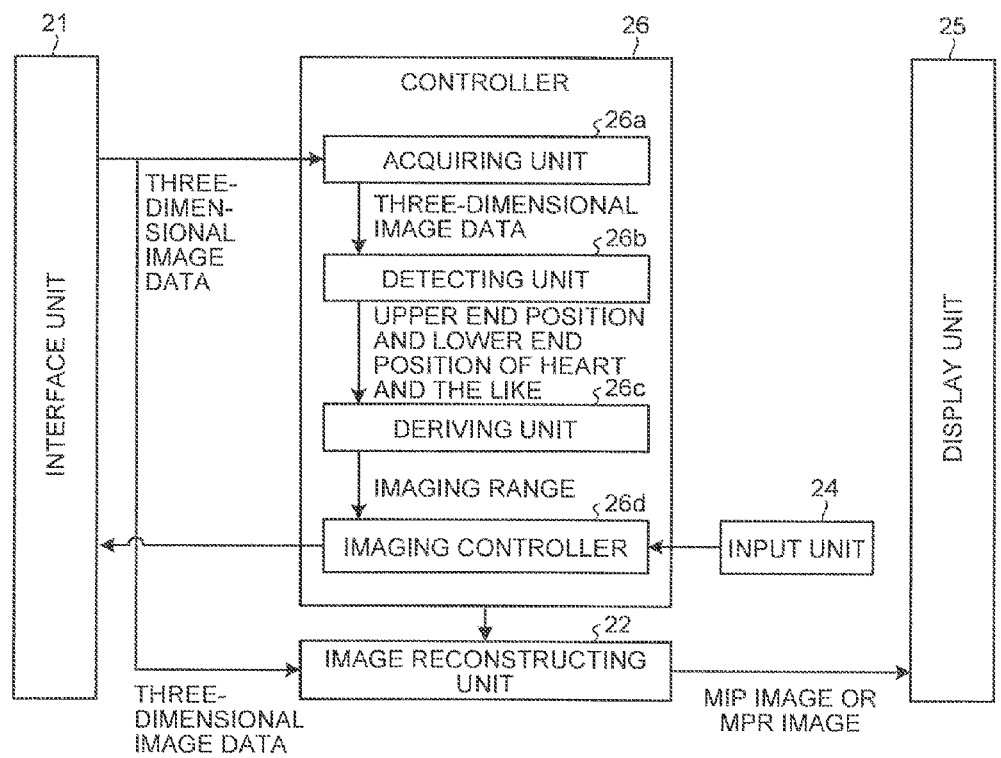
FIG. 16 is a block diagram of a controller and other components according to a second embodiment.

FIG. 16 is a block diagram of a controller 26 and other components according to the second embodiment. As illustrated in FIG. 16, three-dimensional image data acquired under the control of an acquiring unit 26a is also output to an image reconstructing unit 22 in the second embodiment.

The image reconstructing unit 22 generates a maximum intensity projection (MIP) image and a multi-planer reconstructions (MPR) image from the three-dimensional image data. Subsequently, by superimposing an upper end position and a lower end position of the heart detected by a detecting unit 26b and an imaging range derived by a deriving unit 26c on these images thus generated, the image reconstructing unit 22 generates various types of confirmation screens and displays the confirmation screens on a display unit 25. If the operator notices the confirmation screen displayed on the display unit 25, the operator performs adjustment on the confirmation screen as needed and inputs confirmation. If an imaging controller 26*d* receives confirmation, the imaging controller 26*d* controls subsequent imaging in accordance with the contents of the confirmation screen displayed on the display unit 25.

Figure 17:
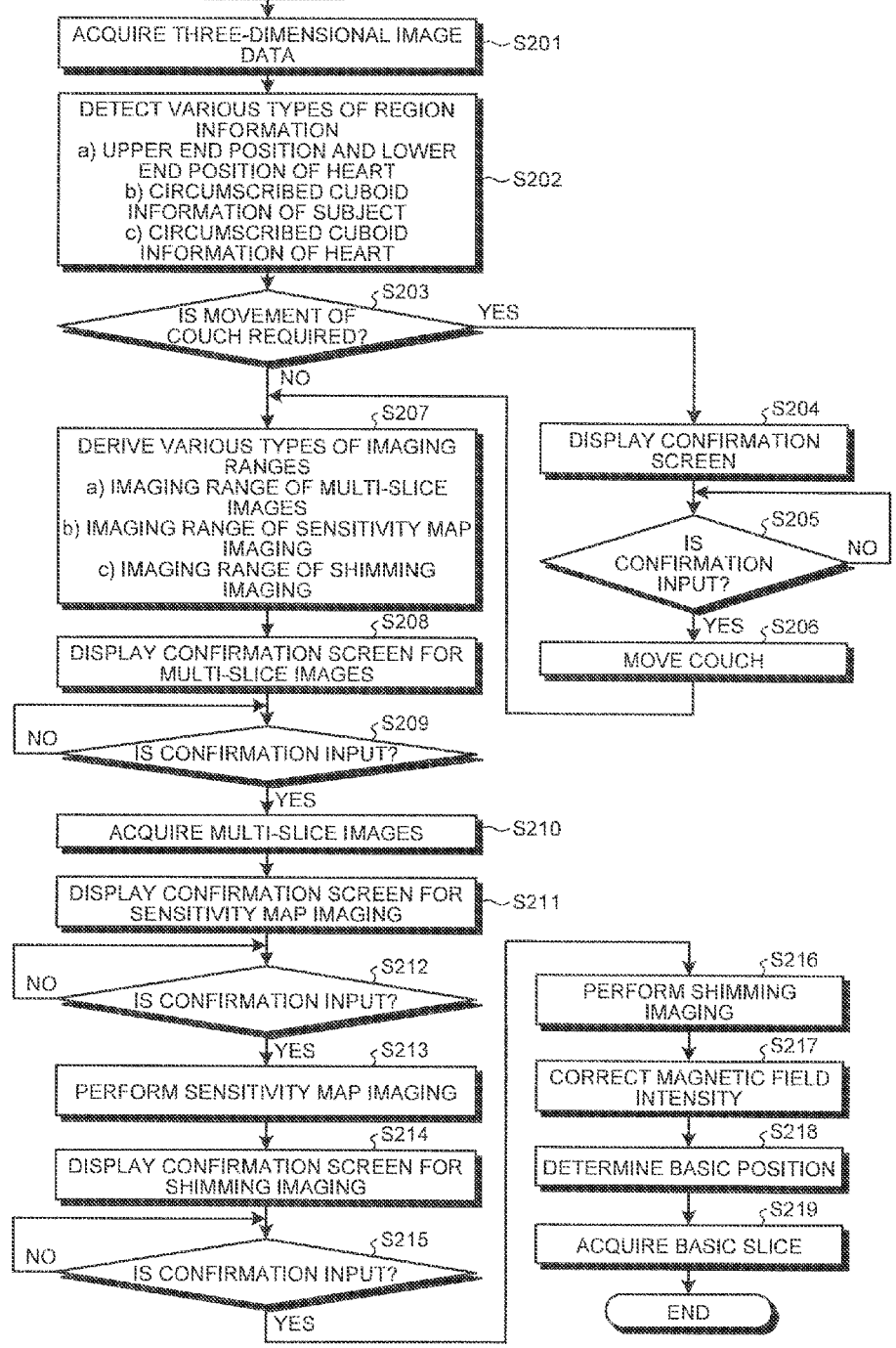
FIG. 17 is a flowchart of a process according to the second embodiment.

FIG. 17 is a flowchart of a process according to the second embodiment. As illustrated in FIG. 17, after it is determined that a couch 4 needs to be moved (Yes at Step S203), display processing of a confirmation screen is performed in the second embodiment. FIG. 18 is a view of the confirmation screen for movement of the couch in the second embodiment. As illustrated in FIG. 18, for example, the image reconstructing unit 22 generates a confirmation screen V1 by superimposing the upper end position and the lower end position (two lines in FIG. 18) of the heart detected by the detecting unit 26*b* on an MIP image on a coronal view and displays the confirmation screen V1 thus generated on the display unit 25 (Step S204). Subsequently, the imaging controller 26*d* determines whether confirmation is input by the operator (Step S205). If confirmation is input (Yes at Step S205), the imaging controller 26*d* controls movement of the couch 4 (Step S206).

Furthermore, as illustrated in FIG. 17, display processing of a confirmation screen is performed before acquisition of multi-slice images (Step S210), performance of sensitivity map imaging (Step S213), and performance of shimming imaging (Step S216) in the second embodiment. FIGS. 19A to 19C are views of the confirmation screens for imaging ranges in the second embodiment. As illustrated in FIG. 19A, for example, the image reconstructing unit 22 generates a confirmation screen V2 by superimposing "a) an imaging range of multi-slice images" (a dotted square in FIGS. 19A to 19C) derived at Step S207 on an MPR image on an axial view and displays the confirmation screen V2 thus generated on the display unit 25 (Step S208). Subsequently, the imaging controller 26*d* determines whether confirmation is input by the operator (Step S209). If confirmation is input (Yes at Step S209), the system control goes to acquisition processing of the multi-slice images (Step S210).

Display of a confirmation screen for sensitivity map imaging (Step S211) and reception of a confirmation (Step S212) and display of a confirmation screen for shimming imaging (Step S214), and reception of a confirmation (Step S215) are performed in the same manner.

The embodiment is not limited to the example described above. To generate the MPR image, the image reconstructing unit 22 may use various types of information detected by the detecting unit 26*b* and optimize the position of the MPR image, for example.

To generate the MPR image on the axial view, the image reconstructing unit 22 may determine a center position of the heart in the superior-inferior direction based on the upper end position and the lower end position of the heart detected by the detecting unit 26*b* and generate an MPR image at the center position, for example. Furthermore, the image reconstructing unit 22 may determine a center position of the heart in the left-right direction based on the circumscribed cuboid information of the heart detected by the detecting unit 26*b* and generate an MPR image on a sagittal view at the center position as illustrated in FIG. 19B, for example. Moreover, the image reconstructing unit 22 may determine a center position of the heart in the anterior-posterior direction based on the circumscribed cuboid information of the heart detected by the detecting unit 26*b* and generate an MPR image on a coronal view at the center position as illustrated in FIG. 19C, for example.

Alternatively, the image reconstructing unit 22 may determine a center position of the heart in the anterior-posterior direction based on the circumscribed cuboid information of the heart detected by the detecting unit 26*b* and generate an MIP image on the coronal view in a manner limiting to three-dimensional image data within a range from the center position, for example. The MIP image and the MPR image are not necessarily generated, and an average value projection image may be generated, for example. Furthermore, an image oblique to the three orthogonal axes (an oblique image) may be generated. Thus, the image reconstructing unit 22 may generate a confirmation screen arbitrarily in accordance with an operational aspect.

As described above, according to the second embodiment, the confirmation screen is displayed as needed, and various types of processing are performed after a confirmation is received. As a result, the operator can make confirmation before the various types of processing are performed, thereby further paying attention to the safety.

While the explanation has been made of the example where the confirmation screen is displayed to receive a confirmation at all the timings of before movement of the couch, before acquisition of the multi-slice images, before performance of sensitivity map imaging, and before performance of shimming imaging in the second embodiment, the embodiment is not limited thereto. The timings for displaying the confirmation screen may be consolidated into once or several times, and a plurality of confirmations may be received simultaneously. Furthermore, omission, addition, and change in order of a part of the confirmations may be made, for example. Moreover, the confirmation screen may be displayed not for the preliminary imaging, such as acquisition of the multi-slice images, sensitivity map imaging, and shimming imaging, but for the main imaging, for example.

In the first embodiment, the explanation has been made of the case where, before the acquisition processing of the three-dimensional image data is started, selection of the types of preliminary imaging subsequent thereto and specification of their order may be received. Similarly, in the second embodiment, before the acquisition processing of the three-dimensional image data is started, selection of the types of preliminary imaging subsequent thereto, specification of their order, selection of whether to display the confirmation screen, and specification of the timing may be received, for example.

Third Embodiment

An MRI apparatus 100 according to a third embodiment is different from that of the first embodiment in that the MRI apparatus 100 acquires a basic slice without performing sensitive map imaging or shimming imaging. FIG. 20 is a flowchart of a process according to the third embodiment. Differences from the first embodiment will be mainly explained below. As illustrated in FIG. 20, in the third embodiment, a detecting unit 26*b* simply needs to detect "a) an upper end position and a lower end position of the heart" (Step S302), and a deriving unit 26*c* simply needs to derive "a) an imaging range of multi-slice images" (Step S305). After an imaging controller 26*d* controls acquisition of the multi-slice images (Step S306), the imaging controller 26*d* proceeds to subsequent processing without performing sensitive map imaging or shimming imaging.

Fourth Embodiment

An MRI apparatus 100 according to a fourth embodiment is different from that of the first embodiment in that the MRI apparatus 100 acquires a basic slice without performing shimming imaging. FIG. 21 is a flowchart of a process according to the fourth embodiment. Differences from the first embodiment will be mainly explained below. As illustrated in FIG. 21, in the fourth embodiment, a detecting unit 26b simply needs to detect "a) an upper end position and a lower end position of the heart" and "b) a circumscribed cuboid region of the subject" (Step S402), and a deriving unit 26c simply needs to derive "a) an imaging range of multi-slice images" and "b) an imaging range of sensitivity map imaging" (Step S405). After an imaging controller 26d controls acquisition of the multi-slice images (Step S406) and performs sensitivity map imaging (Step S407), the imaging controller 26d proceeds to subsequent processing without performing shimming imaging.

Fifth Embodiment

Figure 22:
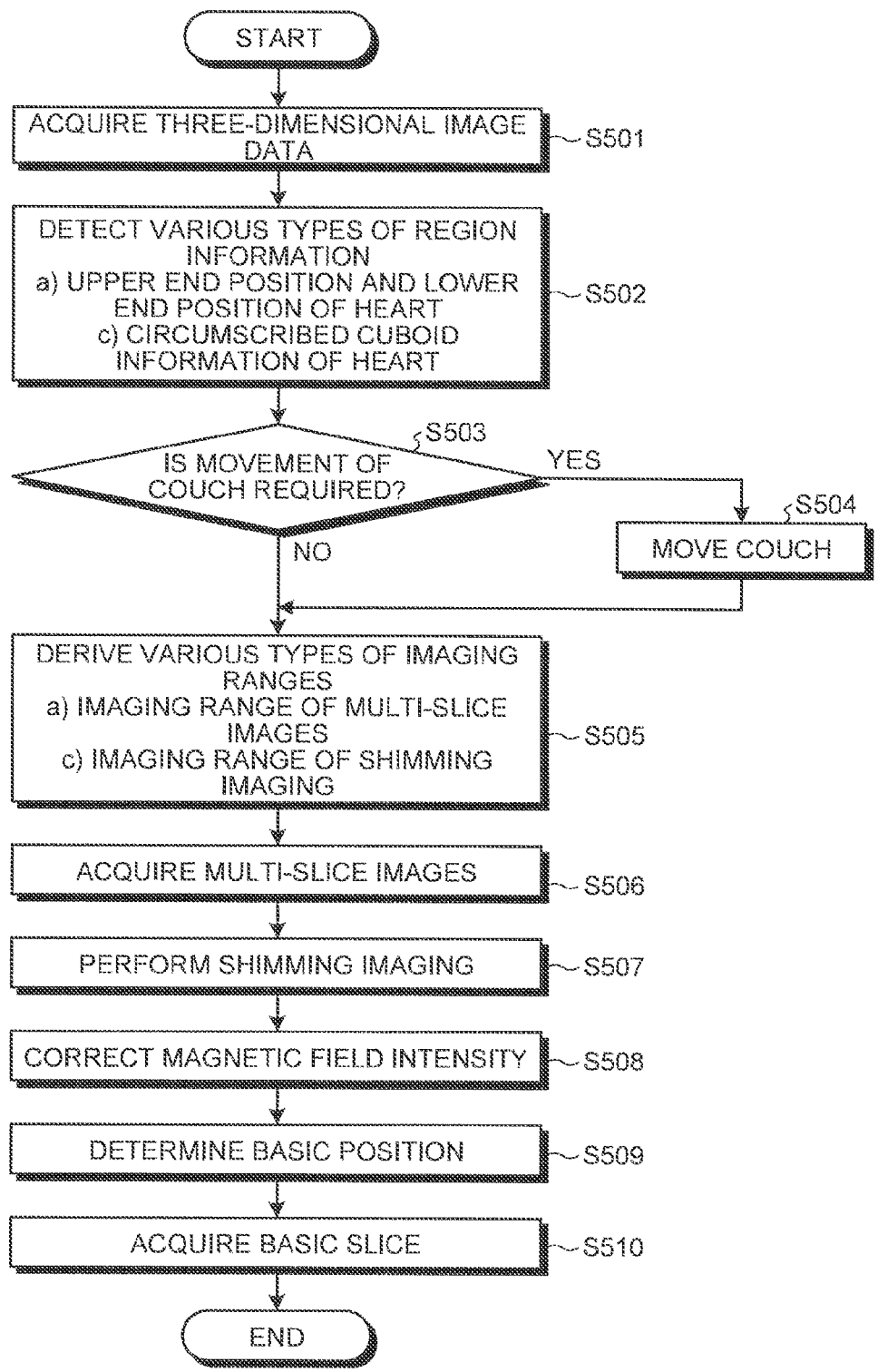
FIG. 22 is a flowchart of a process according to a fifth embodiment.

An MRI apparatus 100 according to a fifth embodiment is different from that of the first embodiment in that the MRI apparatus 100 acquires a basic slice without performing sensitivity map imaging. FIG. 22 is a flowchart of a process according to the fifth embodiment. Differences from the first embodiment will be mainly explained below. As illustrated in FIG. 22, in the fifth embodiment, a detecting unit 26b simply needs to detect "a) an upper end position and a lower end position of the heart" and "c) a circumscribed cuboid region of the heart" (Step S502), and a deriving unit 26c simply needs to derive "a) an imaging range of multi-slice images" and "c) an imaging range of shimming imaging" (Step S505). After an imaging controller 26d controls acquisition of the multi-slice images (Step S506), performs shimming imaging (Step S507), and corrects magnetic field intensity (Step S508), the imaging controller 26d proceeds to subsequent processing without performing sensitivity map imaging.

Other Embodiments

While the explanation has been made of the case where an upper end position and a lower end position of the heart in the superior-inferior direction are detected as the region information in the embodiments described above, the embodiment is not limited thereto. The MRI apparatus 100 may detect both or one end position of the heart in the left-right direction as the region information. The MRI apparatus 100 may detect both or one end position of the heart in the anterior-posterior direction (depth direction) as the region information. The MRI apparatus 100 can select the position (both or one end position in each direction (such as the superior-inferior direction, the left-right direction, and the anterior-posterior direction)) as the region information of the heart suitably if needed. While the explanation has been made of the case where the target organ is assumed to be the heart in the embodiments described above, the embodiment is not limited thereto. The target organ may be an organ other than the heart. If the target organ is the liver, for example, the MRI apparatus 100 detects region information related to the liver in the three-dimensional image data and derives an imaging range of subsequent imaging based on the region information thus detected. The region information related to the liver includes an upper end position and a lower end position of the liver in each direction of the superior-inferior direction, the left-right direction, and the anterior-posterior direction, circumscribed cuboid information of the subject, and circumscribed cuboid information of the liver, for example. The MRI apparatus 100 may detect necessary region information in accordance with an object of the subsequent imaging. If the target organ is the liver, the circumscribed cuboid information of the subject may also serve as the circumscribed cuboid information of the liver.

Furthermore, if the target organ is not limited to the heart, the MRI apparatus 100 does not necessarily perform imaging for acquiring multi-slice images. In other words, in this case, the MRI apparatus 100 simply needs to include an acquiring unit that acquires three-dimensional image data including the target organ, a detecting unit that detects region information related to the target organ in the three-dimensional image data, a deriving unit that derives an imaging range of subsequent imaging in the range of the three-dimensional image data based on the region information, and an imaging controller that controls the subsequent imaging in accordance with the imaging range. In this case, the subsequent imaging may include at least one of shimming imaging, sensitive map imaging, and main imaging for acquiring an image used for diagnosis.

While the explanation has been made of the case where the deriving unit 26c derives the imaging range by calculation processing based on the region information in the embodiments described above, the embodiment is not limited thereto. The deriving unit 26c may store therein in advance a table in which region information is associated with an imaging range and refer to the table, thereby deriving an imaging range, for example. The deriving unit 26c, for example, may store therein in advance a table in which information of the upper end position and the lower end position of the heart is associated with information of an imaging range suitable therefor. Subsequently, the deriving unit 26c may refer to the table using the upper end position and the lower end position detected by the detecting unit 26b to acquire information of the imaging range stored in a manner associated with the upper end position and the lower end position.

The magnetic resonance imaging apparatus according to at least one of the embodiments can facilitate setting of an imaging range.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus, comprising:
    an MRI system scanner including at least one computer configured to:
    acquire three-dimensional MR image data including a target organ in a patient being imaged while disposed on a movable couch;

automatically detect region information providing a spatial domain imaging range including outer boundaries of the target organ in the three-dimensional image data; and control movement of said couch based on a positional relationship between the region information detected from the three-dimensional image data and a magnetic field center.

2. The apparatus according to claim 1, wherein the at least one computer is configured to:

detect as at least part of the region information an upper end position and a lower end position of the target organ; and determine, based on a positional relationship between the upper end position, the lower end position and the magnetic field center, whether the couch needs to be moved.

3. The apparatus according to claim 2, wherein the at least one computer is configured to determine, based on whether the magnetic field center is located between the upper end position and the lower end position, whether the couch needs to be moved.

4. The apparatus according to claim 1, wherein the at least one computer is configured to:

detect as at least part of the region information an upper end position and a lower end position of the target organ, and derive, based on a positional relationship between the upper end position, the lower end position and the magnetic field center, a movement amount of the couch.

5. The apparatus according to claim 1, wherein the at least one computer is configured to:

further derive, based on the region information, an imaging range of multiple subsequent imaging processes to be performed after acquisition of the three-dimensional image data; and control performance of the multiple subsequent imaging processes in accordance with the imaging range.

6. The apparatus according to claim 5, wherein the at least one computer is configured to:

detects as at least part of the region information an upper end position and a lower end position of the target organ;

determine, based on a positional relationship between the upper end position, the lower end position and the magnetic field center, whether the couch needs to be moved;

acquire, after the movement of the couch, the three-dimensional image data including the target organ; and derive, based on the three-dimensional image data acquired after the movement of the couch, the imaging range of the multiple subsequent imaging processes.

7. The apparatus according to claim 1, wherein the target organ includes at least one of a heart and a liver.

8. A magnetic resonance imaging apparatus, comprising: processing circuitry configured to:

acquire three-dimensional image data including a target organ;

detect region information related to the target organ in the three-dimensional image data;

control movement of a couch based on a positional relationship between the region information detected from the three-dimensional image data and a magnetic field center;

derive, based on the region information, an imaging range of multiple subsequent imaging performed after acquisition of the three-dimensional image data; and control performance of the multiple subsequent imaging in accordance with the imaging range, wherein the processing circuitry derives an imaging range of different types of multiple preliminary imaging performed before main imaging as the imaging range of the multiple subsequent imaging.

9. The apparatus according to claim 8, wherein the processing circuitry derives an imaging rage corresponding to a type of the multiple preliminary imaging.

10. The apparatus according to claim 8, wherein the multiple preliminary imaging includes at least one of shimming imaging for acquiring at least data used for homogeneity correction of magnetostatic field intensity, sensitivity map imaging for acquiring data indicating receiving sensitivity distribution of a radio frequency (RF) coil, and support imaging for acquiring support information supporting positioning of an imaging slice of the target organ in the main imaging.

11. The apparatus according to claim 10, wherein the processing circuitry derives an imaging range of the shimming imaging larger than the region information when the shimming imaging is included in the multiple preliminary imaging, derives an imaging range of the support imaging equal to or larger than the imaging range of the shimming imaging when the support imaging is included in the multiple preliminary imaging, and derives an imaging range of the sensitivity map imaging larger than the imaging range of the support imaging when the sensitivity map imaging is included in the multiple preliminary imaging.

12. The apparatus according to claim 8, wherein the processing circuitry performs control so as to perform the multiple subsequent imaging successively.

13. A method for controlling a magnetic resonance imaging (MRI) apparatus, said method comprising performing an MRI process by:

acquiring three-dimensional MR image data including a target organ in a patient being imaged while disposed on a movable couch;

automatically detecting region information providing a spatial domain imaging range including outer boundaries of the target organ in the three-dimensional image data; and controlling movement of said couch based on a positional relationship between the region information detected from the three-dimensional image data and a magnetic field center.

* * * * *